(12) United States Patent
Yoo et al.

(10) Patent No.: US 7,867,790 B2
(45) Date of Patent: Jan. 11, 2011

(54) SUBSTRATE OF PROBE CARD AND METHOD FOR REGENERATING THEREOF

(75) Inventors: Jung-Sun Yoo, Seoul (KR); Seong-Hoon Jeong, Seoul (KR)

(73) Assignee: Phicom Corporation, Seoul (KR)

( * ) Notice: Subject to any disclaimer, the term of this patent is extended or adjusted under 35 U.S.C. 154(b) by 0 days.

(21) Appl. No.: 12/087,270

(22) PCT Filed: Dec. 29, 2006

(86) PCT No.: PCT/KR2006/005878
§ 371 (c)(1), (2), (4) Date: Jun. 30, 2008

(87) PCT Pub. No.: WO2007/075070
PCT Pub. Date: Jul. 5, 2007

(65) Prior Publication Data
US 2009/0002005 A1 Jan. 1, 2009

(30) Foreign Application Priority Data
Dec. 29, 2005 (KR) .................... 10-2005-0133906

(51) Int. Cl.
*G01R 31/26* (2006.01)
*H01R 9/00* (2006.01)
(52) U.S. Cl. .................. 438/18; 324/754; 324/158.1; 324/765; 29/843; 29/825
(58) Field of Classification Search ......... 324/754–765; 438/14–18; 29/600–843
See application file for complete search history.

(56) References Cited
U.S. PATENT DOCUMENTS

| | | | |
|---|---|---|---|
| 5,534,784 A | 7/1996 | Lum et al. | |
| 6,523,255 B2 * | 2/2003 | Shih et al. | 29/843 |
| 6,677,771 B2 | 1/2004 | Zhou et al. | |
| 6,713,686 B2 * | 3/2004 | Becker et al. | 174/262 |
| 6,777,319 B2 * | 8/2004 | Grube et al. | 438/612 |
| 7,180,318 B1 * | 2/2007 | Mahoney et al. | 324/761 |

(Continued)

FOREIGN PATENT DOCUMENTS

CN 095149435 8/2009

(Continued)

OTHER PUBLICATIONS

Statement of Reasons for Invalidation Action and English translation from Taiwanese Patent Office dated Dec. 7, 2009.

*Primary Examiner*—Ha Tran T Nguyen
*Assistant Examiner*—Emily Y Chan
(74) *Attorney, Agent, or Firm*—Harness, Dickey & Pierce, P.L.C.

(57) ABSTRACT

Provided are a substrate of a probe card for installing a plurality of probes thereon to inspect an object by contacting the probes to the object, and a method for repairing the substrate. The substrate includes main channels electrically connected to the probes; and at least one spare channel for replacing the main channels when at least one of the main channels is damaged. Therefore, when some of the main channels of the probe substrate are damaged, the damaged main channels can be repaired using the spare channels and then the probe substrate can be reused, thereby reducing costs required for unnecessary replacement.

4 Claims, 7 Drawing Sheets

U.S. PATENT DOCUMENTS

| | | |
|---|---|---|
| 7,294,909 B2 * | 11/2007 | Casey et al. ................. 257/634 |
| 7,437,813 B2 * | 10/2008 | Tunaboylu et al. ....... 29/402.13 |
| 2005/0146339 A1 | 7/2005 | Grube et al. |
| 2009/0021277 A1 * | 1/2009 | Namburi et al. ............. 324/762 |

FOREIGN PATENT DOCUMENTS

| | | |
|---|---|---|
| JP | 2003-227848 | 8/2003 |
| KR | 10-2002-0014677 | 2/2002 |
| KR | 10-2003-0065978 | 8/2003 |
| KR | 1020030065978 | 8/2003 |
| TW | 549449 | 8/2003 |

* cited by examiner

[Figure 1]
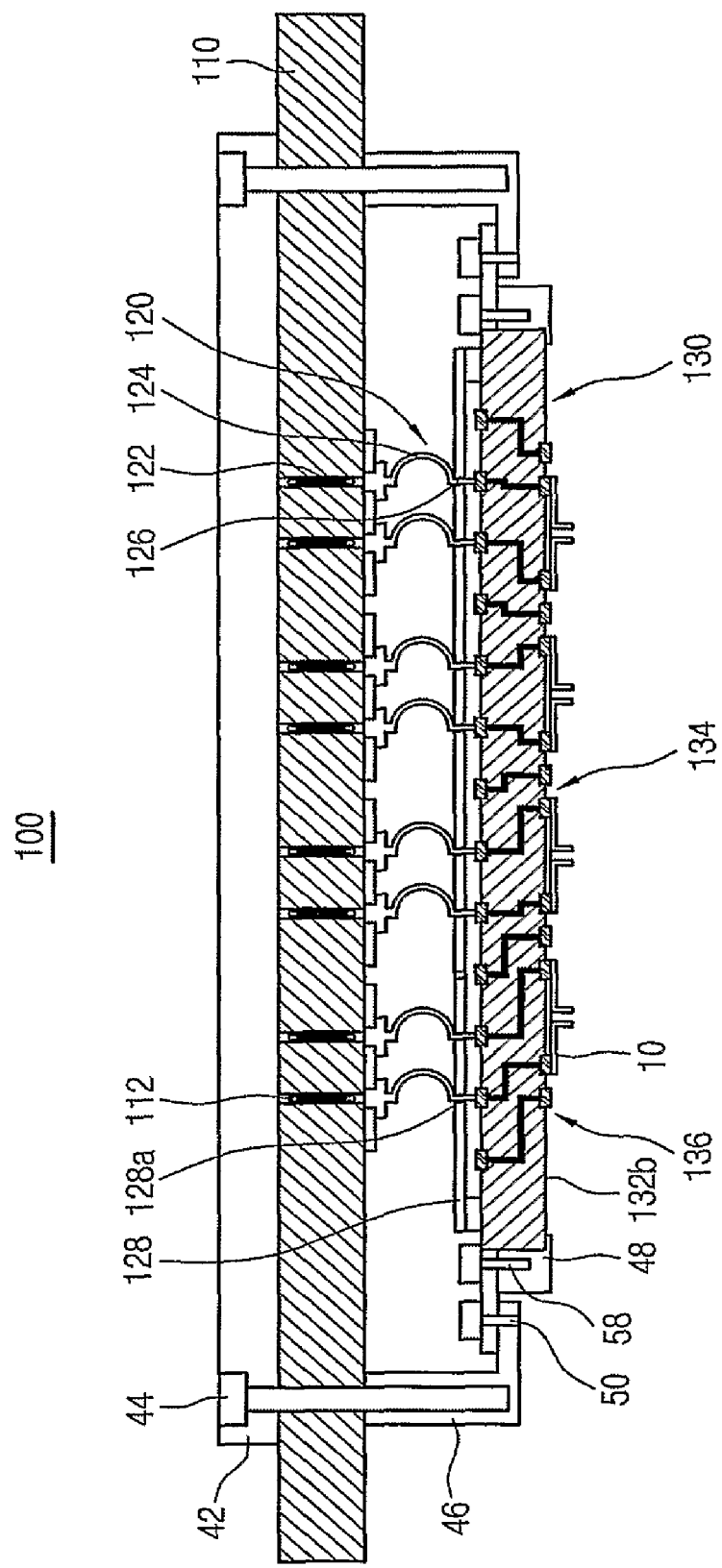

[Figure 2]
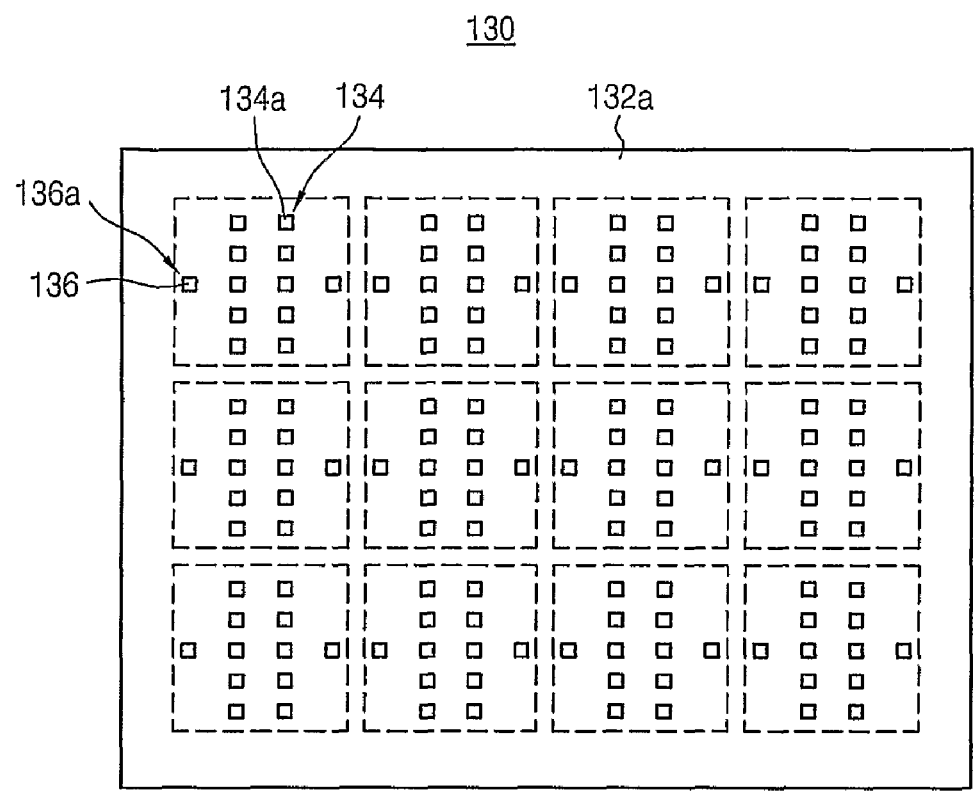

[Figure 3]
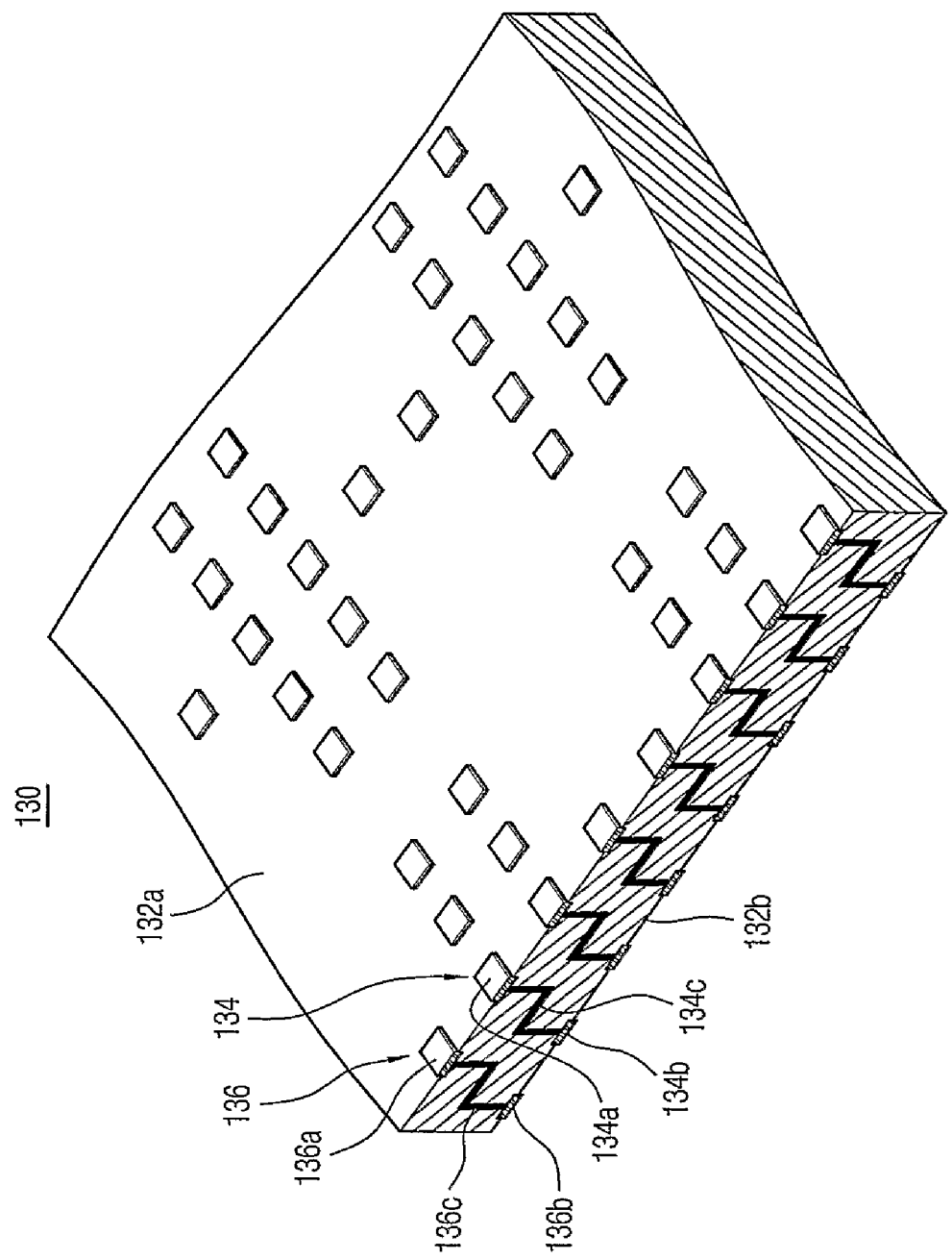

[Figure 4]
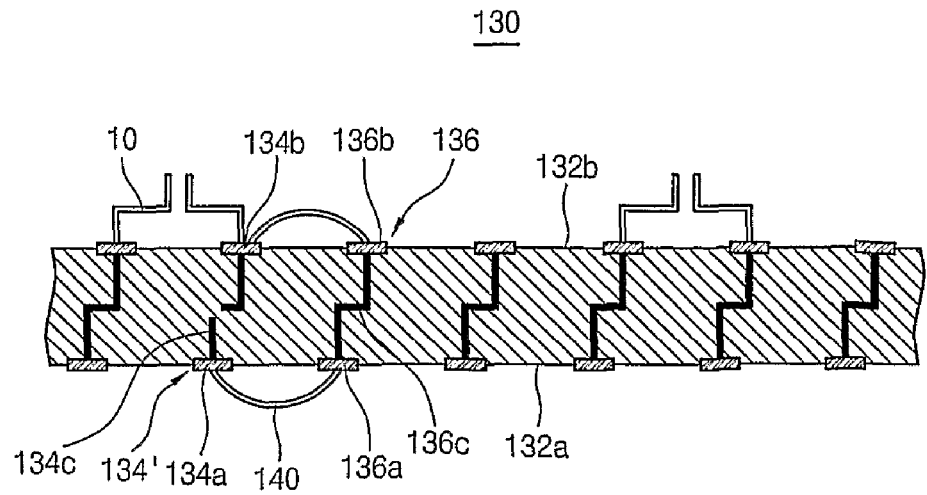
[Figure 5]
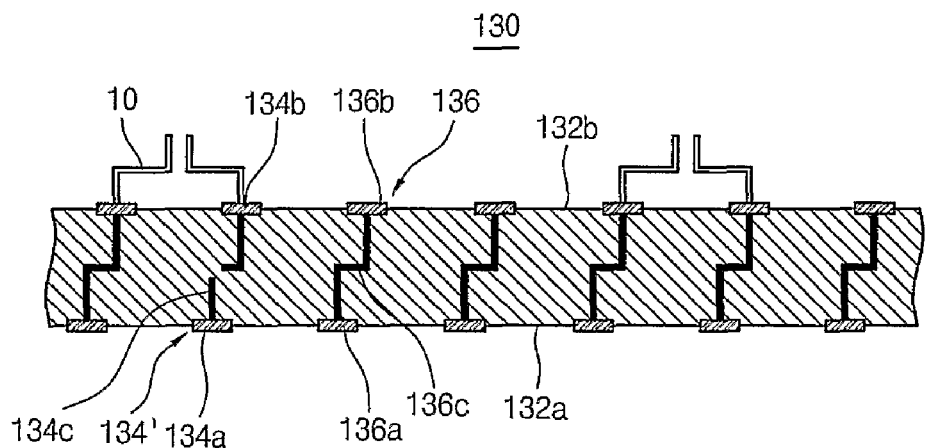
[Figure 6]
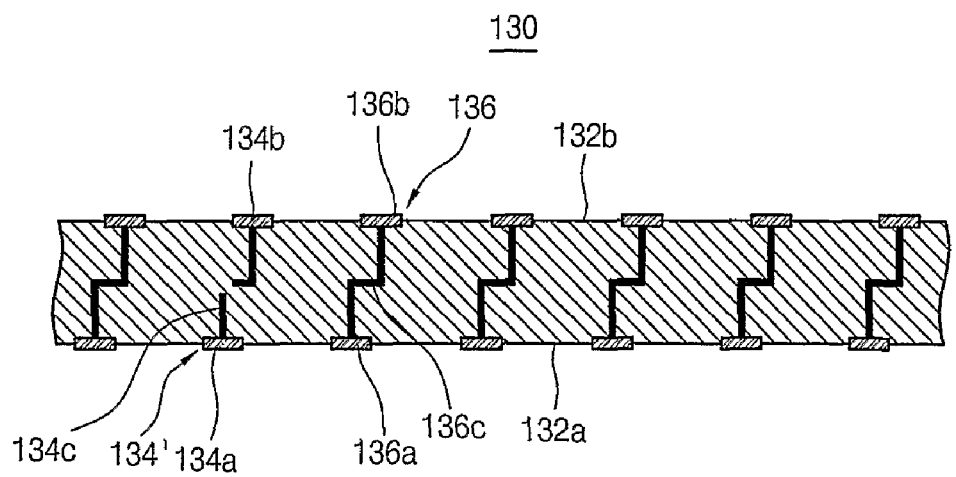

[Figure 7]
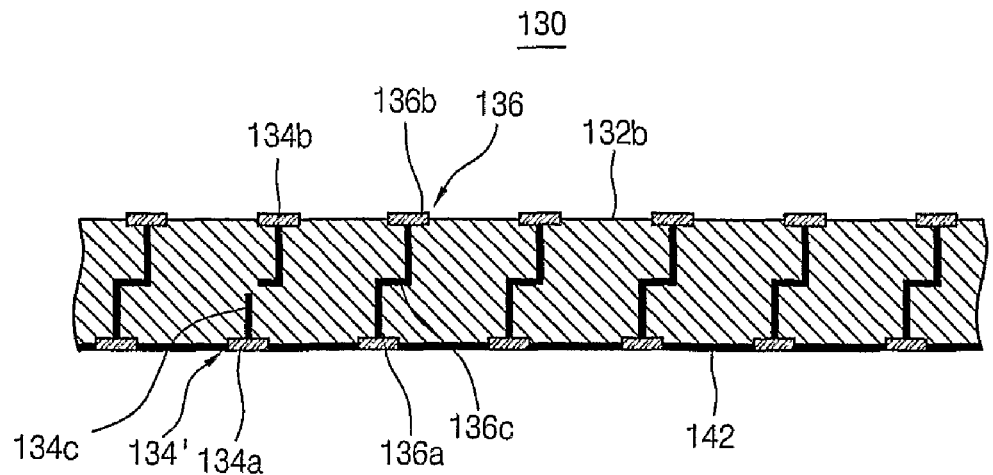
[Figure 8]
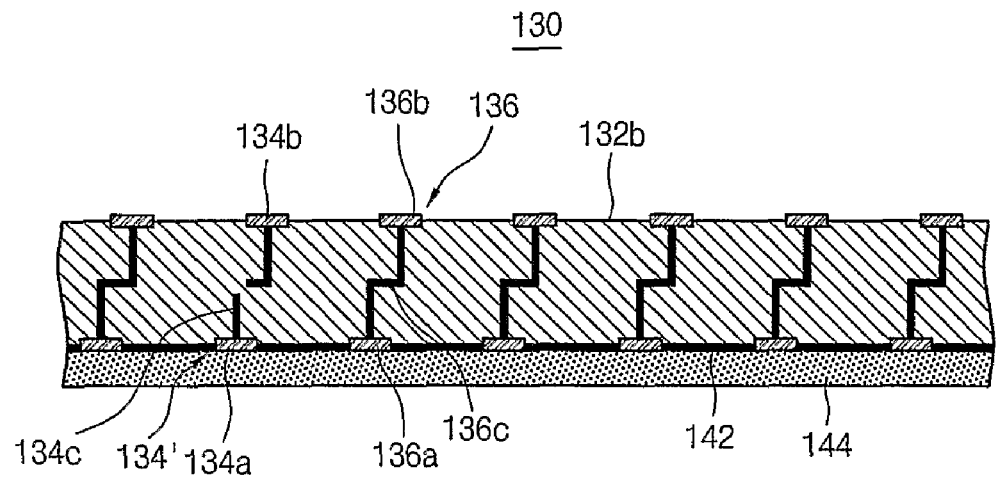
[Figure 9]
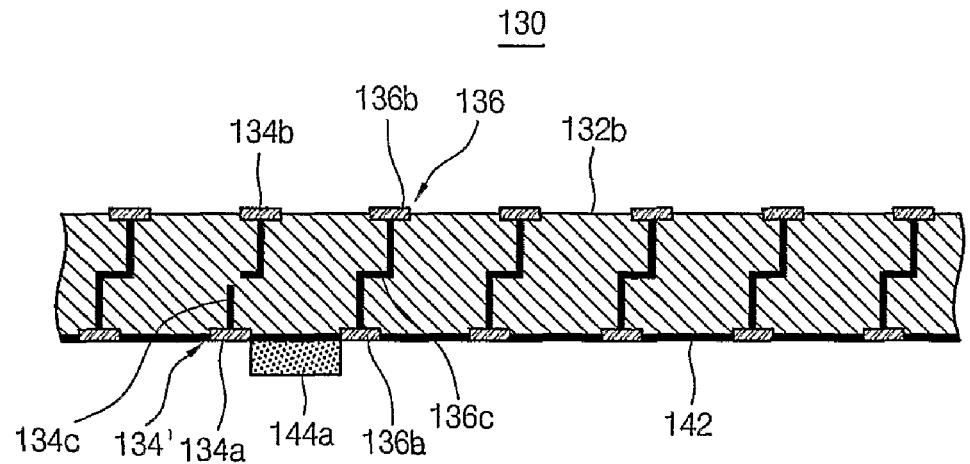

[Figure 10]
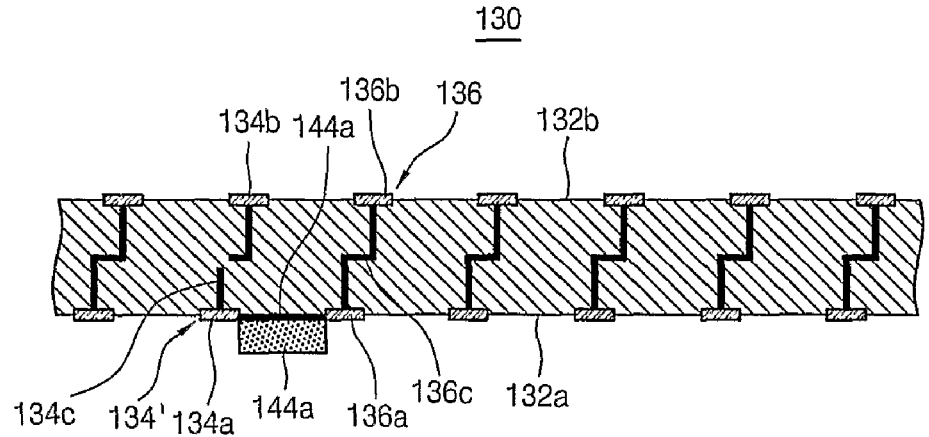
[Figure 11]
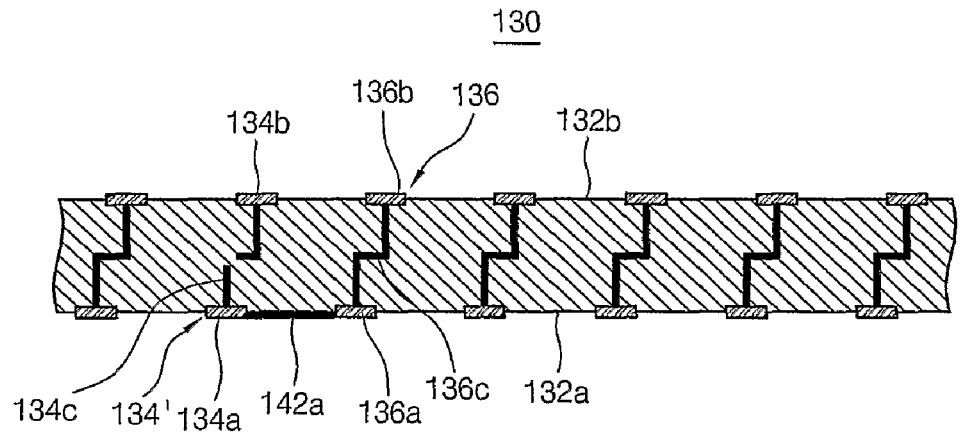
[Figure 12]
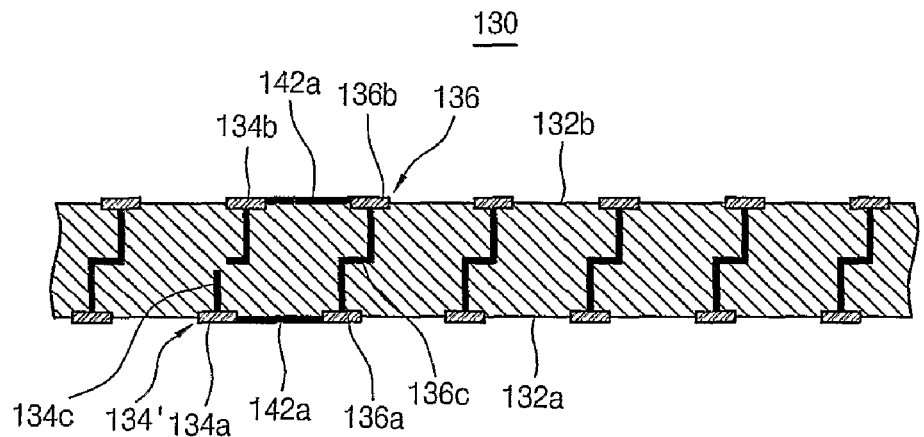

[Figure 13]
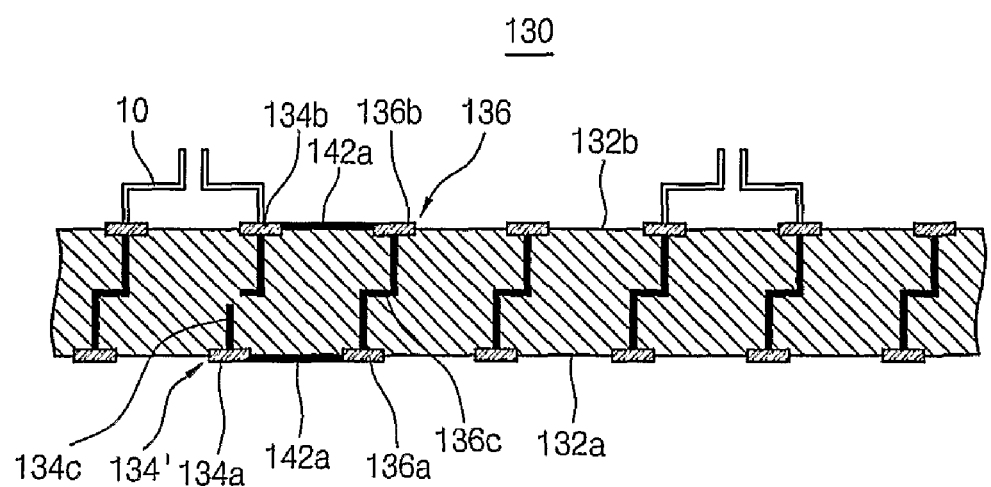

SUBSTRATE OF PROBE CARD AND METHOD FOR REGENERATING THEREOF

TECHNICAL FIELD

The present invention disclosed herein relates to a probe card for inspecting a semiconductor device, and more particularly, to a substrate of a probe card formed with a plurality of probes that make contact with an object for inspecting the object and a method of regenerating the probe card substrate.

BACKGROUND ART

Devices are formed on a wafer by repeating processes such as oxidation, diffusion, etching, and metallization. Then, after slicing and packaging process, the semiconductor devices are shipped. Here, before the slicing process, the semiconductor devices formed on the wafer are inspected through a probing test so as to determine whether a defective semiconductor device is included.

In a probing test, probe tips of a probe card make contact with electrode pads formed on chips of a semiconductor substrate, and a test apparatus applies electric signals to the electrode pads through the probe tips and receives the electric signals returned from the chips so as to determine from returned electric signals whether the chips are defective.

In the probing test for inspecting chips formed on a semiconductor substrate, a probe card on which probe tips are arranged in accordance with a chip pad layout of the semiconductor substrate is used.

DISCLOSURE

Technical Problem

A conventional probe card includes a probe substrate (called also 'space transformer') as disclosed in Korean Patent No. 10-399210. The probe substrate is the most expensive part of the probe card. However, when a signal transmission channel of the probe substrate is damaged in use or aged (signal line aging), the probe card should be replaced with a new one instead of repairing and reusing the probe card.

This increases the costs and time necessary for manufacturing semiconductor devices and makes it difficult to respond rapidly to customers changing demands.

Technical Solution

The present invention provides a substrate of a probe card that can be reused after regenerating and a method of regenerating the substrate.

The present invention also provides a substrate of a probe card designed to reduce replacement costs and a method of regenerating the substrate.

Embodiments of the present invention provide substrates of probe cards for installing a plurality of probes thereon to inspect an object by contacting the probes to the object, the substrates including main channels electrically connected to the probes; and at least one spare channel for substituting the main channels when at least one of the main channels is damaged.

In some embodiments, each of the main channels and the spare channel includes: a first terminal receiving an electrical signal; a second terminal contacting the probe; and an internal line connecting the first and second terminals.

In other embodiment, the first and second terminals of the spare channel are spaced apart from the first and second terminals of the main channel by a predetermined distance, and the maximum value of the predetermined distance may be 40 mm.

In still other embodiments, the damaged main channel is substituted with the spare channel by connecting the first and second terminals of the damaged main channel to the first and second terminals of the spare channel using jumping lines, and the jumping lines may be formed of conductive wires.

In even other embodiment, the damaged main channel is substituted with the spare channel by connecting the first and second terminals of the damaged main channel to the first and second terminals of the spare channel using additional conductive lines.

In yet other embodiment, the jumping lines and the additional conductive lines are formed of a material selected from the group consisting of copper, gold, tungsten, an alloy of gold, an alloy of copper, an alloy of tungsten.

In other embodiment of the present invention, there are provided methods for regenerating a substrate of a probe card, the methods including: when a damaged main channel is detected among the main channels, connecting the damaged main channel to one of the spare channels that is closest to the damaged main channel.

In some embodiments, the damaged main channel and the spare channel is connected using jumping lines formed of conductive wires.

In still other embodiments of the present invention, there are provided methods for regenerating a substrate of a probe card, the methods including: detecting a damaged main channel among the main channels; removing the proves connected to the damaged main channel; electrically connecting the damaged main channel to one of the spare channel that is closest to the damaged main channel by connecting first and second terminals of the damaged main channel to first and second terminals of the closest spare channel using additional lines; and installing the probes on the main channels.

In some embodiments, the connecting of the damaged main channel includes: depositing a conductive layer; forming a passivation layer on the conductive layer; patterning the passivation layer so as to form a passivation pattern having a shape connecting the terminal of the damaged channel to the terminal of the closest spare channel; removing the conductive layer except for a region of the conductive layer covered with the passivation pattern; and removing the passivation pattern.

In other embodiments, the conductive layer is formed of a material selected from the group consisting of copper, gold, tungsten, an alloy of gold, an alloy of copper, and an alloy of tungsten.

Advantageous Effects

According to the present invention, when some of the main channels of the probe substrate are damaged, the damaged main channels can be regenerated using the spare channels and then the probe substrate can be reused, thereby reducing costs required for unnecessary replacement.

DESCRIPTION OF DRAWINGS

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIG. 1 is a schematic view illustrating a probe card according to an embodiment of the present invention;

FIG. 2 is a plan view illustrating a probe substrate according to an embodiment of the present invention;

FIG. 3 is a partial perspective view of a probe substrate according to an embodiment of the present invention;

FIG. 4 is a partial cross-sectional view illustrating a spare channel and a damaged main channel that are connected using wires according to an embodiment of the present invention; and FIGS. 5 through 13 are views for explaining a regenerating method of connecting a spare channel and a damaged main channel using additional lines according to an embodiment of the present invention.

BEST MODE

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration.

Hereinafter, it will be described about exemplary embodiments of the present invention in conjunction with FIGS. 1 through 13. In FIGS. 1 through 13, like reference numerals denote like elements.

The present invention provides a substrate (multi-layer circuit substrate) of a probe card that can be reused after regenerating defective wiring of the substrate occurred due to aging, for example, and a method of regenerating the substrate of the probe card (probe substrate). For this, the probe substrate of the present invention includes main channels electrically connected to probes and spare channels for substituting damaged main channels.

FIG. 1 is a schematic view illustrating a probe card according to an embodiment of the present invention, FIG. 2 is a plan view illustrating a probe substrate according to an embodiment of the present invention, and FIG. 3 is a partial perspective view illustrating a probe substrate according to an embodiment of the present invention.

Referring to FIGS. 1 through 3, a probe card 100 includes a printed circuit substrate 110, a probe substrate 130, inter-connectors 120, and a supporting structure. The printed circuit substrate 110 includes a plurality of contact holes 112 connected to an inner circuit. The probe substrate 130 includes a plurality of probes 10 attached to a bottom surface thereof. In operation, the probes 10 make contact with an object to be inspected (chips on a wafer). The inter-connectors 120 are formed between the printed circuit substrate 110 and the probe substrate 130 as an interface structure that electrically connecting the printed circuit substrate 110 and the probe substrate 130. The supporting structure fixes the probe substrate 130 to the printed circuit substrate 110. The supporting structure includes reinforcement plates 42, 46, and 48 and bolts 44, 50, and 58 that are disposed at top and bottom surfaces of the printed circuit substrate 110 and the probe substrate 130. The probe substrate 130 can be fixed to the printed circuit substrate 110 by fastening the components of the supporting structure.

The printed circuit substrate 110 includes a plurality of substrate terminals (not shown) arranged with respective to a vertical axis and a horizontal axis. The substrate terminals are made up of plurality of dots or pads formed on a surface of the printed circuit substrate 110. Further, conductive contacts (not shown) are formed by coating the contact holes 112 of the printed circuit substrate 110 with a conductive material such as copper.

The inter-connectors 120 include first connectors 126, second connectors 122, and connecting portions 124. The second connectors 122 are inserted into the contact holes 112. The second connectors 122 has a hollow, elongated, o-ring shape, such that the second connectors 122 can be tight fitted into the contact holes 112. That is, when the second connectors 122 are inserted into the contact holes 112, the second connectors 122 shrink and then return to their original shapes by elasticity. Therefore, when fully inserted into the contact holes 112, the connectors 122 can make tight contact with the conductive contacts formed inside the contact holes 112. The connecting portions 126 are disposed between the printed circuit substrate 110 and the probe substrate 130 that are spaced a predetermined distance from each other. The first connectors 126 are guide by holes 128a formed in a second guide film 128 so as to be connected to first terminals 134a of main channels 134 formed in the probe substrate 134. The inter-connectors 120, which electrically connect the printed circuit substrate 110 and the probe substrate 130 as an interface structure, can be formed into various shapes. The probes 10, the probe substrate 130 including the main channels 134, the inter-connectors 120, and the inner circuit of the printed circuit substrate 110 are electrically connected with one another.

The probe substrate 130 has a multi-layer circuit substrate structure. The probe substrate 130 includes the main channels 134 connecting the probes 10 and the inter-connectors 120 and spare channels 136 for substituting damaged main channels 134. In the current embodiment, two spare channels 136 are additionally provided for one device under test (DUT). However, one or at least three spare channels 136 can be provided for one DUT. Here, the term DUT is used to denote chips on a wafer that make contact with the probe card 100 for being tested (FIG. 2 may be helpful for understanding the relationship between the number of spare channels and the DUT in the current embodiment).

The main channels 134 include the first terminals 134a, second terminals 134b, and internal lines 134c. The first terminals 134a are formed on a first surface 132a of the probe substrate 130 and are connected to the first connectors 126 of the inter-connectors 120. The second terminals 134b are formed on a second surface 132b of the probe substrate 130 and are connected to the probes 10. The internal lines 134c are formed in the probe substrate 130 to electrically connect the first terminals 134a to the corresponding second terminals 134b.

Like the main channels 134, the spare channels 136 include first terminals 136a formed on the first surface 132a of the probe substrate 130, second terminals 136b formed on the second surface of the probe substrate 130, and internal lines 136c formed in the probe substrate 130 to electrically connect the first and second terminals 136a and 136b. The first and second terminals 136a and 136b of the spare channel 136 can be electrically connected to the first and second terminals 134a and 134b of a damaged main channel 134' using jumping lines 140 (refer to FIG. 4) or additional lines 142a (refer to FIG. 13). Here, when connecting the spare channel 136 and the main channel 134, it is important that the spare channel 136 and the main channel 134 are connected using a material having a low resistance so as to allow a signal to be transmitted through the spare channel 136 in the same electrical conditions as when it is transmitted through the main channel 134. In an embodiment of the present invention, a low-resistance material such as copper, gold, tungsten, or an alloy thereof can be used to connect the spare channel 136 and the main channel 134. In this case, a negligible resistance value (about 0.01 ohm or less) may be added by the material used to connect spare channel 136 and the main channel. For example, after the first and second terminals 136a and 136b of the spare channel 136 are connected to the first and second terminals 134a and 134b of a damaged main channel 134' using jumping lines 140 or additional lines 142a, a line resistance value between the first and second terminals 134a and 134b of the damaged main channel 134' may range from 0.1 ohm to 0.5 ohm. For this, the spare channels 136 are formed at both sides of lows or columns of the main channels 134 each corresponding to a die of a wafer to be tested. Further, the spare channels 136 are spaced apart from the main channels 136 by 1 mm to 40 mm (the closer the better). When the spare channel 136 is spaced apart from the main channel 136 by 40 mm or more, the reliability of a test using the probe card 100 may be decreased due to an increase in line resistance. For example, a reference line resistance range can be set according to the maximum and minimum distances between the spare channels 136 and the main channels 134.

FIG. 4 is a partial cross-sectional view illustrating a spare channel and a damaged main channel that are connected using wires according to an embodiment of the present invention.

Referring to FIG. 4, in the current embodiment, when one of main channels 134 of a probe substrate 130 is damaged, first and second terminals 134a and 134b of the damaged main channel 134' are electrically connected to first and second terminals 136a and 136b of a spare channel 136 that is closest to the damaged main channel 134' using jumping lines 140 formed of conductive wires. In this regenerating process, the probe substrate 130 can be reused.

MODE FOR INVENTION

FIGS. 5 through 13 are views for explaining a regenerating method of connecting a spare channel and a damaged main channel using additional lines according to an embodiment of the present invention. In the method of the current embodiment, when one of main channels of a probe card is damaged, the damaged main channel is regenerated as follows.

Referring to FIGS. 5 through 13, probes 10 are removed from a probe substrate 130 (refer to FIG. 6). Additional lines 142a are formed by photolithograph and thin layer forming processes so as to connect first and second terminals 134a and 134b of a damaged main channel 134' to first and second terminals 136a and 136b of a spare channel 136 that is closest to the damaged main channel 134'. Forming the additional lines 142a includes depositing a conductive layer 142 on a first surface 132a of the probe substrate 130 (refer to FIG. 7). The conductive layer 142 is formed by selectively depositing a metal (or alloy) having a high conductivity such as copper, gold, and tungsten all over the first surface 132a of the probe substrate 130 using photolithograph and thin layer deposition technologies. The deposition of the high-conductive metal (alloy) may be formed by physical vapor deposition (PVD), chemical vapor deposition (CVD), electrolytical plating, electroless plating, or the like. Next, a passivation layer 144 is formed by applying photoresist to the conductive layer 142 (refer to FIG. 8). The passivation layer 144 is patterned by photolithograph so as to form a passivation pattern 144a between the first terminal 134a of the damaged main channel 134' and the first terminal 136a of the spare channel 136 (refer to FIG. 9). Next, except for a portion of the conductive layer covered by the passivation pattern 144a, the conductive layer 142 is removed by a predetermined method such as etching (refer to FIG. 10). Then, the passivation pattern 144a is removed. In this way, the additional line 142a is formed on the first surface 132a of the probe substrate 130 so as to connect the first terminal 134a of the damaged main channel 134' to the first terminal 136a of the spare channel 136 (refer to FIG. 11).

Referring to FIG. 12, the other of the additional lines 142a is formed on a second surface 132b of the probe substrate 130 so as to connect the second terminal 134b of the damaged main channel 134' to the second terminal 136b of the spare channel 136 in the same way as described above. Thus, a detailed description thereof will be omitted.

After the additional lines 142a are formed on the first and second surfaces 132a and 132b of the probe substrate 130, the probes 10 are attached to the second terminals 132b of the probe substrate 130 again (refer to FIG. 13). In this way, the regenerating of the damaged main channel 134' of the probe substrate 130 is completed.

As shown in FIGS. 4 and 13, when one of the main channels 134 of the probe substrate 130 is damaged and thus a test signal cannot be normally transmitted, the damaged main channel 134' can be regenerated using the spare channel 134. Therefore, the probe substrate 130 can be reused instead of replacing it with a new one. That is, as described above, the first and second terminals 136a and 136b of the spare channel 136 are connected to the first and second terminals 134a and 134b of the damaged main channel 134' using the jumping lines 140 (or the additional lines 142a) so as to transmit a test signal to the probe 10 through the first terminal 134a of the damaged main channel 134', the jumping line 140 (or the additional line 142a), the spare channel 136 (the first terminal 136a-> the internal line 136c-> the second terminal 136b), the jumping line 140 (or the additional line 142a), the second terminal 134b of the damaged main channel 134'. Therefore, the probe substrate 130 can be reused without waste by regenerating a damaged portion.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

INDUSTRIAL APPLICABILITY

According to the present invention, when some of the main channels of the probe substrate are damaged, the damaged main channels can be regenerated using the spare channels and then the probe substrate can be reused, thereby reducing costs required for unnecessary replacement.

The invention claimed is:

1. A method for regenerating a substrate of a probe card, the substrate including main channels and spare channels, the main channels providing electrical signals to probes when the probes make contact with an object to be inspected, the spare channels being used for substituting the main channels when at least one of the main channels is damaged, the method comprising:

detecting a damaged main channel among the main channels;

removing the probes connected to the damaged main channel;

electrically connecting the damaged main channel to one of the spare channel that is closest to the damaged main channel by connecting first and second terminals of the damaged main channel to first and second terminals of the closest spare channel using additional lines; and
installing the probes on the main channels.

2. The method of claim 1, wherein the connecting of the damaged main channel comprises:

depositing a conductive layer;

forming a passivation layer on the conductive layer;

patterning the passivation layer so as to form a passivation pattern having a shape connecting the terminal of the damaged channel to the terminal of the closest spare channel;

removing the conductive layer except for a region of the conductive layer covered with the passivation pattern; and removing the passivation pattern.

3. The method of claim 2, wherein the conductive layer is formed of a material selected from the group consisting of copper, gold, tungsten, an alloy of gold, an alloy of copper, and an alloy of tungsten.

4. The method of claim 1, wherein electrically connecting the damaged main channel to one of the spare channel is performed without removing the spare channel.

* * * * *